United States Patent [19]

Maemura et al.

[11] Patent Number: 5,751,181
[45] Date of Patent: May 12, 1998

[54] POWER AMPLIFIER CIRCUIT

[75] Inventors: Kousei Maemura; Kazuya Yamamoto, both of Tokyo, Japan

[73] Assignee: Mitsubishi Denki Kabushiki Kaisha, Tokyo, Japan

[21] Appl. No.: 797,265

[22] Filed: Feb. 7, 1997

[30] Foreign Application Priority Data

Jul. 16, 1996 [JP] Japan .................................. 8-185900

[51] Int. Cl.$^6$ .................................................. H03K 17/687
[52] U.S. Cl. ........................... 327/434; 327/427; 327/323; 327/538
[58] Field of Search .................................. 327/427, 430, 327/431, 434, 435, 375, 312, 316, 323, 538, 541

[56] References Cited

U.S. PATENT DOCUMENTS

| | | | |
|---|---|---|---|
| 4,492,883 | 1/1985 | Janutka | 327/430 |
| 4,716,356 | 12/1987 | Vyne et al. | 327/103 |
| 5,422,608 | 6/1995 | Levesque | 327/77 |
| 5,495,198 | 2/1996 | Chen | 327/427 |

FOREIGN PATENT DOCUMENTS

| | | |
|---|---|---|
| 62-203406 | 9/1987 | Japan . |
| 4156105 | 5/1992 | Japan . |

*Primary Examiner*—Toan Tran
*Attorney, Agent, or Firm*—Leydig, Voit & Mayer, Ltd.

[57] ABSTRACT

A power amplifier circuit includes a first field effect transistor power amplifier having a gate; a gate voltage supply for supplying a gate voltage to the gate of the first field effect transistor; and a gate voltage control including a second field effect transistor which has the same threshold voltage as the first field effect transistor. The gate voltage control receives, as an input voltage, the gate voltage output from the gate voltage supply, and increases the gate voltage when the gate voltage is lower than the threshold voltage of the first field effect transistor, preventing the first field effect transistor from being pinched off. Therefore, when the pinch-off voltage of the first field effect transistor varies or when the voltage supplied from the gate voltage supply varies, unwanted pinch-off of the first field effect transistor is avoided in the lower power consumption state so that the stability of the circuit is improved.

9 Claims, 6 Drawing Sheets

POWER AMPLIFIER CIRCUIT

FIELD OF THE INVENTION

The present invention relates to a power amplifier circuit used for radiocommunication, a control circuit for the power amplifier circuit, and an integrated power amplifier and control circuit.

BACKGROUND OF THE INVENTION

In order to improve the portability of a wireless telephone, especially a portable telephone, miniaturization of the telephone has been promoted. For this purpose, a reduction in the number of parts constituting the telephone, i.e., an increase in the integration density of functional elements in the circuit, has been promoted. The biggest and heaviest constituent of the telephone is a battery. In order to reduce the size of the battery, the power consumption of the circuit must be reduced to increase the duration of the battery even though the capacity of the battery is small. Further, when the telephone is used in the vicinity of the base station, sufficient communication can be made even when the output power of radio signals from the telephone is low. Hence, it is desired that the signal transmission be performed with the minimum output power according to the distance from the base station because the current consumption of a power amplifier in the telephone is approximately proportional to the output power.

In a conventional portable telephone, a power amplifier is controlled in a circuit structure as shown in FIG. 9. In FIG. 9, reference numeral 1 designates a power amplifier. Reference characters $P_{in}$ and $P_{out}$ designate a signal input terminal and a signal output terminal of the power amplifier 1, respectively. Reference characters $V_{dd}$ and $V_{gg}$ designate a drain voltage terminal and a gate voltage terminal of the power amplifier 1, and characters $V_{dd}$-H and $V_{gg}$-H designate H level signals on the signal transmission lines. A frequency converter 10 is connected to the input terminal $P_{in}$ of the power amplifier 1, and a control circuit 11 is connected to the drain voltage terminal $V_{dd}$ and the gate voltage terminal $V_{gg}$ of the power amplifier 1. A power detector circuit 12 is connected to the output terminal $P_{out}$ of the power amplifier 1. In this circuit, voltages applied to the terminals $V_{dd}$ and $V_{gg}$ are controlled by the control circuit 11 according to the power detected by the power detector circuit 12, whereby the signal transmission is performed with the minimum output power according to the distance between the telephone and the base station to reduce the power consumption.

A portable telephone uses a high frequency, 0.9 GHz or 1.5 GHz, and a PHS (personal handy phone system) also uses a high frequency, 1.9 GHz. So, GaAs elements, which consume less power at such high frequencies than Si elements, are employed as power amplifiers in these telephones. However, when GaAs MESFETs (Metal Semiconductor Field Effect Transistors) are employed, a negative voltage, for example, −2 V, is needed.

By the way, in the circuit structure shown in FIG. 9, the power detector circuit 12 and the control circuit 11 that controls $V_{dd}$ and $V_{gg}$ in response to the power detector circuit 12 are included, and these constituents increase the size and the weight of the portable telephone. Since the PHS aims at reduced size and weight compared with the portable telephone, the structure shown in FIG. 9 is not suitable to the PHS. Therefore, in the PHS, a power amplifier is controlled by switching between the high output mode and a low output mode.

FIG. 10 is a circuit diagram illustrating a power amplifier employed in the PHS and circuit components in the vicinity of the power amplifier. In FIG. 10, the same reference numerals as those shown in FIG. 9 designate the same or corresponding parts. A power amplifier 1 comprises a GaAs MESFET J20, capacitors C111 and C112 for eliminating high frequency components from signals transmitted to a gate voltage control circuit 13, a resistor R111 connected between a gate of the FET J20 and the capacitor C112, and an inductor L111 connected to a drain of the FET J20. Two diodes D111 and D112 are connected between the gate voltage control circuit 13 and the power amplifier 1. In this structure, for power control of the power amplifier 1, only signals applied to the gate terminal $V_{gg}$ are used, and the drain terminal $V_{dd}$ is not used. Further, for the power control of the power amplifier 1, the gate voltage $V_{gg}$ is provided in two stages, and output signals from the power amplifier 1 are not detected. So, it is necessary to set the gate voltage $V_{gg}$ so that a prescribed output power is attained. In the structure shown in FIG. 9, since the output power is detected and fed forward to control the output power, setting of the gate voltage $V_{gg}$ to attain a prescribed output power is not necessary.

In the structure shown in FIG. 10, the gate voltage control circuit 13 changes the gate voltage $V_{gg}$ between "High" and "Low" on the basis of a power control signal from the control circuit 11. When the power amplifier 1 is a GaAs FET, the gate voltage $V_{gg}$ must be a negative voltage. Therefore, the gate voltage control circuit 13 includes a circuit for generating a negative voltage.

FIG. 11 shows an example of the gate voltage control circuit 13 shown in FIG. 10. The gate voltage control circuit 13 includes an FET J121 and a resistor R121. Reference character $V_{ss}$ denotes a negative voltage signal from a negative voltage generator, and character $V_{gc}$ denotes an internal signal for controlling the gate voltage.

A description is given of the operation of the gate voltage control circuit 13. Initially, when the gate voltage of the FET J121 is 0 V, the gate to source voltage $V_{gsJ121}$ of the FET J121 is determined by the current consumed by the FET J121. Therefore, the voltage at the terminal $V_{gg}$ is lower than the voltage $V_{gc}$ by the voltage of $V_{gsJ121}$, that is, $$V_{gg}=V_{gc}-V_{gsJ121} \qquad (1)$$

Hence, when $V_{gc}$ is 0 V and $V_{gsJ121}$ is 0.2 V, $V_{gg}$ is −0.2 V. With the voltage $V_{gg}$ (−0.2 V), the power amplifier 1 is controlled so that it operates at a high output.

In the state of low power consumption, when the voltage $V_{gc}$ is set at −1 V, the voltage $V_{gg}$ is −1.2 V. In this state, when the FET as the power amplifier 1 (hereinafter referred to as an amplifier FET) has a pinch-off voltage $V_p$>1.2, the power consumption of the power amplifier 1 is reduced.

On the other hand, when the voltage $V_{gc}$ is −1.5 V,−1.7 v is output from the gate voltage control circuit 13. In this case, when the amplifier FET has a pinch-off voltage $V_p$=1.5 V, no current flows into the FET, so that the FET does not serve as a power amplifier.

In order to avoid this problem, in the structure shown in FIG. 10, two backward diodes D111 and D112 are connected between the gate voltage terminal $V_{gg}$ and the grounding terminal. Assuming that the forward voltages of these diodes are respectively 0.6 V, when $V_{gg}$ drops to a voltage lower than −1.2 V, current flows through the diodes D111 and D112, whereby the voltage $V_{gg}$ is set at −1.2 V. In this way, the backward diodes D111 and D112 avoid the unwanted reduction in the gate voltage $V_{gg}$ to a voltage lower than the pinch-off voltage of the amplifier FET, which reduction makes the power amplifier 1 inoperable.

In the structure shown in FIG. 10, when the pinch-off voltage $V_p$ of the amplifier FET (J20 in FIG. 10) varies due to variations in the wafer stage process, for example, when the pinch-off voltage is 1.8 V, in order to realize the above-mentioned reduction in the power consumption, the voltage $V_{gg}$ must be reduced to a voltage lower than −1.2 V to make a difference between $V_{gg}$ and $V_p$ small. However, in the clamping circuit including the diodes D111 and D112 shown in FIG. 10, the gate voltage $V_{gg}$ cannot be lower than −1.2 V, so that it is not applicable to the case mentioned above.

As described above, in the conventional power amplifier circuit in which the power amplifier is switched between the high output mode and the low output mode, when the pinch-off voltage of the FET constituting the power amplifier varies due to variations in wafer stage processing, a sufficient power-saving effect cannot be achieved.

SUMMARY OF THE INVENTION

It is an object of the present invention to provide a power amplifier circuit that operates stably with low power consumption, regardless of the threshold voltage of an FET constituting a power amplifier.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a power amplifier circuit comprises a power amplifying means comprising a first field effect transistor having a gate; a gate voltage supply means for supplying a gate voltage to the gate of the first field effect transistor; and a gate voltage control means comprising a second field effect transistor for monitoring, which has the same threshold as the first field effect transistor, the gate voltage control means receiving, as an input voltage, the gate voltage output from the gate voltage supply means, and increasing the gate voltage when the gate voltage is lower than the threshold of the first field effect transistor constituting the power amplifying means, thereby to prevent the first field effect transistor from pinching off. Therefore, when the pinch-off voltage of the first field effect transistor varies or when the voltage supplied from the gate voltage supply means varies, unwanted stopping of the first field effect transistor is avoided in the low power compensation state, whereby the stability of the circuit is improved.

According to a second aspect of the present invention, in the above-mentioned power amplifier circuit, the second field effect transistor constituting the gate voltage control means has a gate length shorter than that of the first field effect transistor constituting the power amplifying means. Therefore the voltage supplied from the gate voltage supply means can be reduced to the pinch-off voltage of the first field effect transistor, whereby the power amplifying means can be operated with the lowest power consumption.

According to a third aspect of the present invention, in the above-mentioned power amplifier circuit, the ground side voltage of the second field effect transistor is set at a voltage lower than the grounding voltage by connecting a ground side electrode of the second field effect transistor to a negative voltage terminal through a diode. Therefore, the circuit is hardly affected by variations in the wafer process, so that the gate voltage on the design is attained, resulting in an improved yield.

According to a fourth aspect of the present invention, in the above-mentioned power amplifier circuit, the ground side voltage of the second field effect transistor is set at a voltage lower than the grounding voltage by connecting a ground side electrode of the second field effect transistor to a source electrode of a normally off field effect transistor, gate and drain electrodes of which are connected to a grounding terminal, and to a negative voltage terminal through a circuit comprising at least a resistor. Therefore, the voltage of the ground side electrode of the second field effect transistor does not vary with variations in the temperature, so that the gate voltage on the design is surely attained. As a result, the yield and the operating stability are further improved.

According to a fifth aspect of the present invention, in the above-mentioned power amplifier circuit, the gate voltage control means comprises an inverter circuit comprising the second field effect transistor for monitoring that has the same threshold as the first field effect transistor constituting the power amplifying means; a source follower circuit comprising a third field effect transistor; and a fourth field effect transistor for power supply, connected in parallel with the third field effect transistor and having a gate to which an output from the inverter circuit is applied; and the gate voltage control means supplies current to the gate voltage supply means. In this circuit, the fourth field effect transistor for power supply is feedback-controlled with the output from the inverter circuit to supply current to the gate voltage supply means. Therefore, the current compensation by the negative voltage supply is reduced.

According to a sixth aspect of the present invention, in the above-mentioned power amplifier circuit, the fourth field effect transistor for power supply has a gate width narrower than that of the third field effect transistor constituting the source follower circuit. Therefore, the switching of the feedback operation becomes slow, and variations in the gate voltage and unstable operation due to the feedback operation are avoided.

According to a seventh aspect of the present invention, in the above-mentioned power amplifier circuit, a resistor element is connected, in series, to the fourth field effect transistor for power supply. Therefore, in addition to the above-mentioned effects relating to the feedback operation, since the circuit is hardly affected by variations in the wafer process, the gate voltage on the design is easily attained, resulting in an improved yield.

DETAILED DESCRIPTION OF THE PREFERRED EMBODIMENTS

[Embodiment 1]

Figure 1:
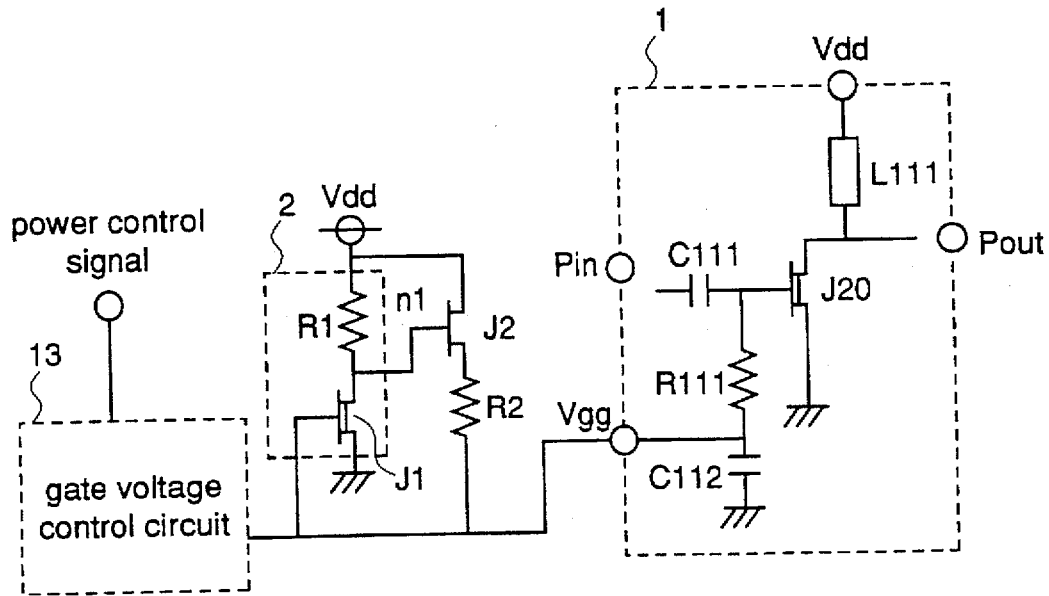
FIG. 1 is a diagram illustrating a power amplifier circuit according to a first embodiment of the present invention.

FIG. 1 is a diagram illustrating a power amplifier circuit according to a first embodiment of the present invention. In FIG. 1, the same reference numerals as those shown in FIG. 8 designate the same or corresponding parts. The power amplifier circuit includes an inverter circuit 2 that comprises an FET J1 and a load resistor R1. The FET J1 has a channel dopant concentration equal to that of an FET constituting the power amplifier 1. The FET J1 has a gate to which an output from the gate voltage control circuit 13 is input, a source grounded, and a drain connected to the load resistor R1. An output from the inverter circuit 2 is input to a gate of an FET J2. A drain of the FET J2 is connected to a drain voltage terminal $V_{dd}$, and a source of the FET J2 is connected through a resistor R2 to the output terminal of the gate voltage control circuit (gate voltage supply means) 13. The FETs J1 and J2 and the resistors R1 and R2 constitute a gate voltage control means for the power amplifier 1.

A description is given of the operation of the power amplifier circuit.

When the power amplifier 1 is operated in the high-power output state, the voltage $V_{gg}$ is about −0.2 V as in the conventional circuit. With this $V_{gg}$, since the FET J1 in the inverter circuit 2 is in the ON state, the resistance of the FET J1 decreases, and the gate voltage n1 of the FET J2 becomes "Low" due to the voltage drop of the resistor R1. Thereby, the resistance of the FET J2 increases, and the current passing through the FET J2 and the resistor R2 is very small. Therefore, the voltage $V_{gg}$ hardly varies due to the current applied to the gate voltage control circuit 13 through the FET J2 and the resistor R2. As a result, the FET J20 constituting the power amplifier 1 operates at high-power output.

When the power amplifier 1 is operated in the low power consumption state, the voltage $V_{gg}$ is reduced to −1.2 V. Also in this case, since the channel structure of the FET J1 in the inverter 2 is identical to that of the FET J20 in the power amplifier 1, when the pinch-off voltage $V_p$ of the FET J20 is −1.5 V, the pinch-off voltage $V_p$ of the FET J1 is −1.5 V. Therefore, when the voltage $V_{gg}$ is reduced to −1.2 V, the FET J1 is in the ON state, and the circuit comprising the FETs J1 and J2 and the resistors R1 and R2 operates in the same way as in the high-power output operation. That is, $V_{gg}$ hardly varies due to the current applied to the gate voltage control circuit 13 through the FET J2 and the resistor R2.

When the voltage $V_{gg}$ is reduced to −1.7 V due to variations in the fabrication of the FET constituting the gate voltage control circuit 13, no current flows through the FET J1 due to pinch off of the FET J1. In this state, the voltage drop in the FET J1 is larger than across the resistor R1, and the gate voltage n1 of the FET J2 increases. The increase in the gate voltage n1 makes current flow through the FET J2 and the resistor R2. As a result, a voltage corresponding to the current flowing through the FET J2 and the resistor R2 is generated, and the voltage $V_{gg}$ increases by the generated voltage.

As described above, according to the first embodiment of the invention, when the voltage $V_{gg}$ drops to the pinch-off voltage of the FET J20 constituting the power amplifier 1, the circuit comprising the FETs J1 and J2 and the resistors R1 and R2 operates so that the voltage $V_{gg}$ is not reduced to a voltage lower than the pinch-off voltage of the FET J20. Therefore, even when the pinch-off voltage of the FET J20 varies or the voltage $V_{gg}$ varies, unwanted stopping of the FET J20, i.e., the power amplifier 1, is avoided in the low power consumption state, whereby the stability of the circuit is improved.

Further, in order to compensate the variation in the pinch-off voltage of the FET J20 constituting the power amplifier 1, the supply of the gate voltage from the gate voltage control circuit is controlled so that the voltage $V_{gg}$ in the low power consumption state of the power amplifier 1 is, for example, about −1.8 V. Thereby, a voltage determined by the circuit comprising the FETs J1 and J2 and the resistors R1 and R2 is always supplied as the voltage $V_{gg}$. Therefore, when the pinch-off voltage $V_p$ of the FET J20 varies in either the positive direction or the negative direction with respect to the design value, the voltage $V_{gg}$ is controlled so that it follows the variation range. As a result, an integrated circuit with a good yield is realized.

[Embodiment 2]

Figure 2:
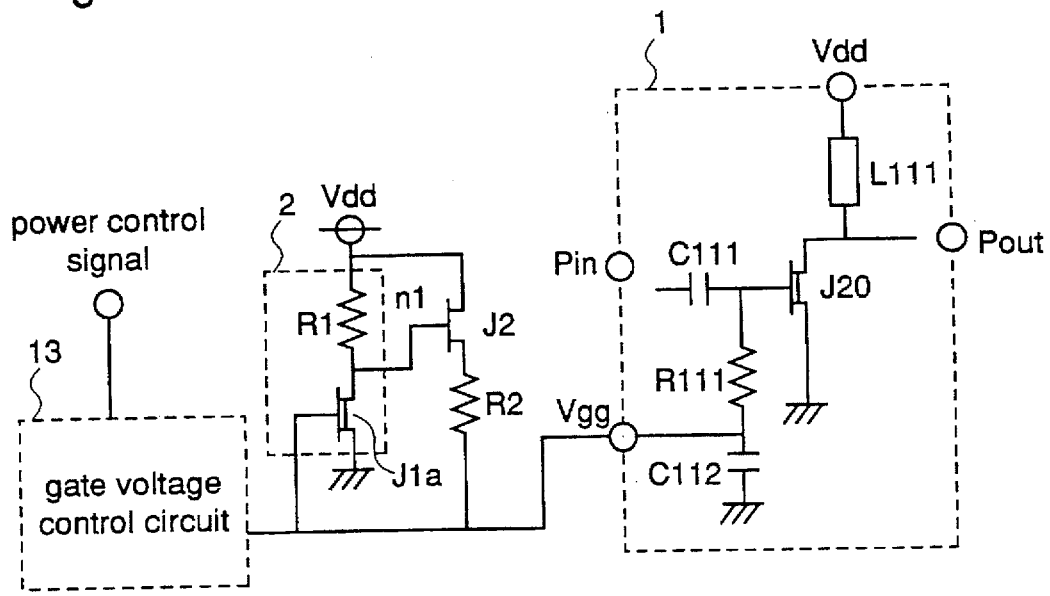
FIG. 2 is a diagram illustrating a power amplifier circuit according to a second embodiment of the present invention.

FIG. 2 is a circuit diagram illustrating a power amplifier circuit according to a second embodiment of the present invention. This power amplifier circuit is different from the power amplifier circuit according to the first embodiment in that an FET J1a having a gate length shorter than that of the FET J20 constituting the power amplifier 1 is employed in place of the FET J1.

Figure 3:
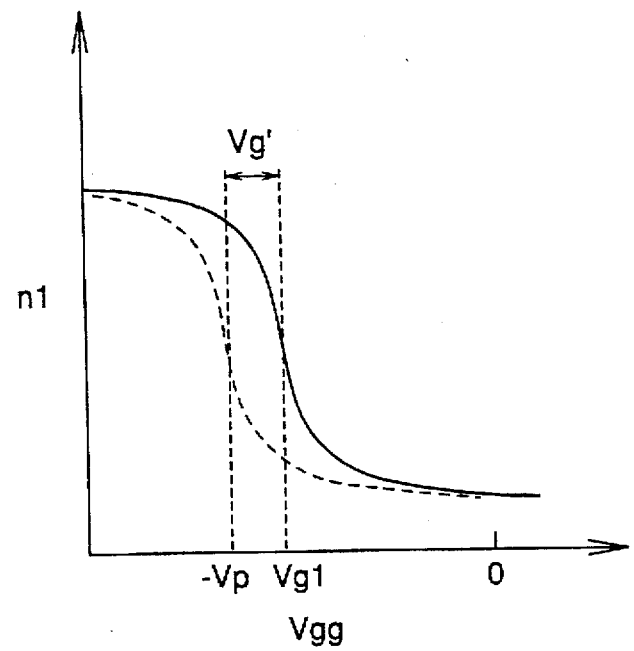
FIG. 3 is a graph illustrating I/O characteristics of an inverter circuit included in the power amplifier circuit according to the second embodiment.

Generally, the threshold $V_p$ of an FET increases with a reduction in the gate length. So, in order to reduce current in an FET having a short gate length, the gate voltage must be reduced. FIG. 3 shows the I/O characteristics of an inverter circuit 2 comprising an FET and a resistor. In FIG. 3, $V_{gg}$ is an input signal to the inverter circuit 2, and n1 is an output signal from the inverter circuit 2. The solid line shows the I/O characteristics of the power amplifier circuit shown in FIG. 1 and the dotted line shows the I/O characteristics of the power amplifier circuit shown in FIG. 2. More specifically, in the power amplifier circuit shown in FIG. 1, the FET J1 starts to turn off when the input signal to the inverter circuit 2, i.e., $V_{gg}$, drops to a voltage $V_{g1}$ that is higher than $-V_p$ by $V_{g'}$, so that the voltage of the output signal from the inverter circuit 2, i.e., n1, starts to increase before the FET J1 completely turns off. Therefore, the voltage $V_{gg}$ applied to the power amplifier 1 cannot be set at the pinch-off voltage $-V_p$. As a result, in the structure according to the first embodiment, the power consumption during the operation at low power cannot be sufficiently suppressed.

On the other hand, in the structure according to the second embodiment of the invention, since the gate length of the FET J1a constituting the inverter circuit 2 is shorter than the gate length of the FET J20 constituting the power amplifier 1, the pinch-off voltage $V_p$ of the FET J1a is, by $V_{g'}$, lower than the pinch-off voltage $V_p$ of the FET J20, whereby turning on of the FET J2 is delayed as shown by the dotted line in FIG. 3. Therefore, the voltage $V_{gg}$ input to the power amplifier 1 can be made equal to the pinch-off voltage $-V_p$ of the FET J20.

According to the second embodiment of the invention, in addition to the same effects as provided by the first embodiment of the invention, the voltage $V_{gg}$ can be reduced to the pinch-off voltage $V_p$ of the FET J20 constituting the power amplifier 1, whereby the power amplifier 1 is operated in the state where the power consumption is at the lowest.

[Embodiment 3]

Figure 4:
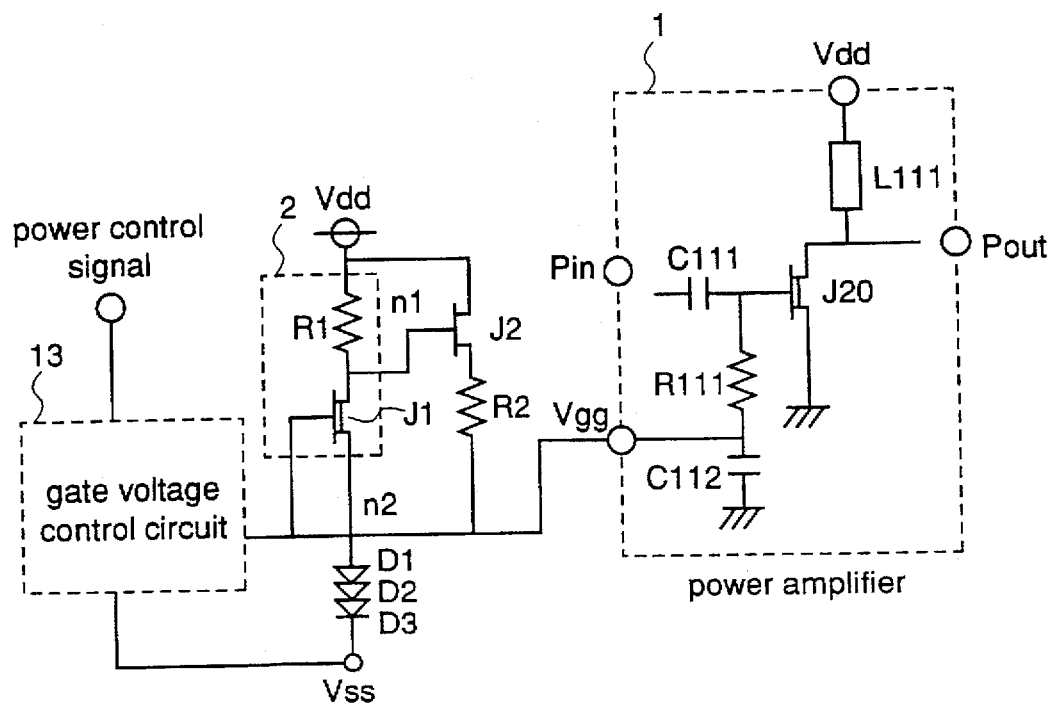
FIG. 4 is a diagram illustrating a power amplifier circuit according to a third embodiment of the present invention.

FIG. 4 is a circuit diagram illustrating a power amplifier circuit according to a third embodiment of the present invention. In the second embodiment the pinch-off voltage $V_p$ of the FET J1a constituting the inverter circuit 2 is made larger than the pinch-off voltage $V_p$ of the FET J20 constituting the power amplifier 1 to reduce the voltage $V_{gg}$ that changes the output from the inverter circuit 2. In this third embodiment the source voltage of the inverter circuit 2 is made lower than the ground voltage.

As shown in FIG. 4, the power amplifier circuit according to the third embodiment includes multistage diodes D1, D2, and D3 which are connected between the source of the FET J1 and the negative voltage terminal $V_{ss}$ so that cathode electrodes of these diodes are on the negative voltage terminal $V_{ss}$ side. When the negative voltage $V_{ss}$ is –2 V and the forward voltage $V_f$ of each diode is 0.6 V, the source voltage n2 of the FET J1 is given by $$n2 = -2 + 0.6 \times 3 = -0.2 \ V \quad (2)$$

Therefore, by setting this voltage to $V_g$, as shown in FIG. 3, the voltage $V_{gg}$ can be made equal to the pinch-off voltage $V_p$ of the FET J20 constituting the power amplifier 1, whereby the power amplifier 1 is operated where the power consumption is the lowest. Further, since the same effects as provided by the second embodiment are realized by adding elements (diodes) to the circuit, compared with the method according to the second embodiment in which the gate of the FET is controlled using a process technique, the circuit is hardly affected by variations in wafer processing. Consequently, the voltage $V_{gg}$ of the design is easily attained, resulting in an improved yield.

[Embodiment 4]

Figure 5:
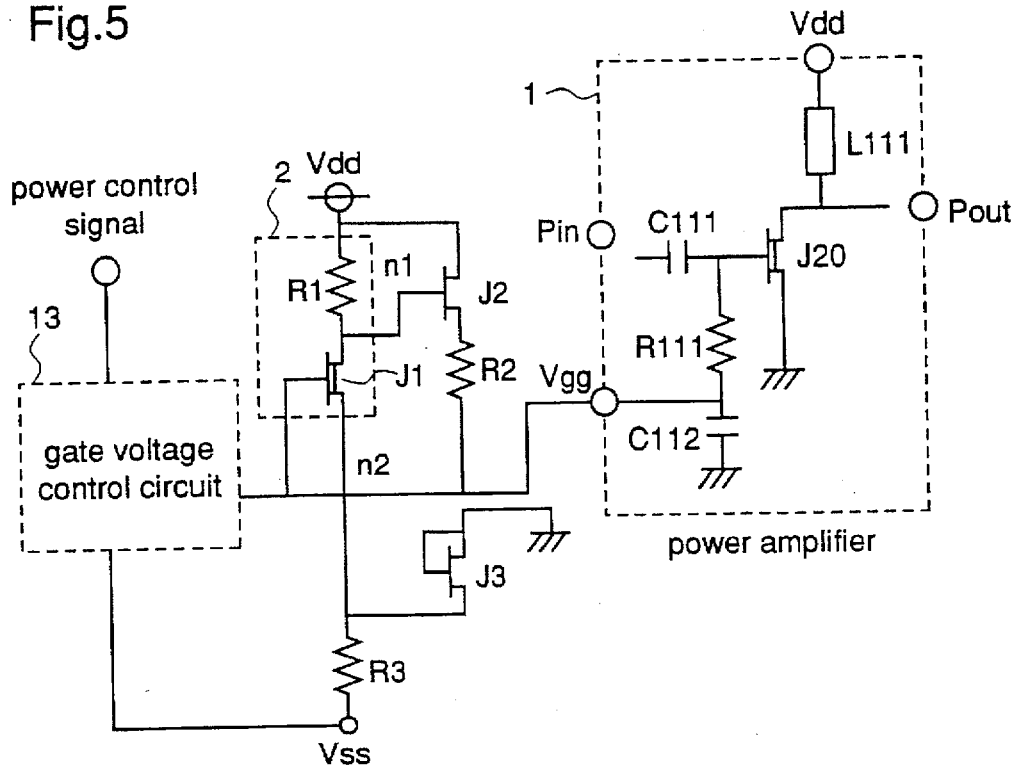
FIG. 5 is a diagram illustrating a power amplifier circuit according to a fourth embodiment of the present invention.

FIG. 5 is a circuit diagram illustrating a power amplifier circuit according to a fourth embodiment of the invention. As shown in FIG. 5, the power amplifier circuit includes an FET J1 having a source electrode connected to the source terminal n2 of the FET J1 constituting the inverter circuit 2, and gate and drain electrodes connected to the grounding terminal. Further, the circuit includes a resistor R3 connected between the source terminal n2 of the FET J1 and the negative voltage terminal $V_{ss}$. The FET J3 is a normally-off FET (E-FET) employed in a digital circuit constituting the gate voltage control circuit 13.

A description is given of the function and effect of the power amplifier circuit.

The threshold voltage $V_{th}$ of an E-FET in a GaAs integrated circuit is usually in a range from 0.05 V to 0.25 V. When the threshold voltage $V_{th}$ of the FET J3 is 0.1 V, the voltage at the source terminal n2 of the FET J1 can be reduced to a voltage about 0.2 V lower than the grounding voltage by controlling the resistor R3. Thereby, the I/O characteristics of the inverter circuit 2 vary as in the third embodiment, so that the voltage $V_{gg}$ that changes the output from the inverter circuit 2 is reduced to the pinch-off voltage $V_p$ of the FET J20 constituting the power amplifier 1, whereby the power amplifier 1 is operated at the lowest power consumption. Further, since the above-mentioned effect is realized by adding elements to the circuit, the circuit is hardly affected by variations in wafer processing, so that the voltage $V_{gg}$ of the design is attained, resulting in an improved yield. In the power amplifier circuit according to the third embodiment of the invention, since the voltage applied to the source terminal n2 of the FET J1 is reduced by the diodes, the voltage drop amount varies with the temperature. In this fourth embodiment, however, since the circuit does not includes diodes, the characteristics are not adversely affected by temperature changes.

[Embodiment 5]

Figure 6:
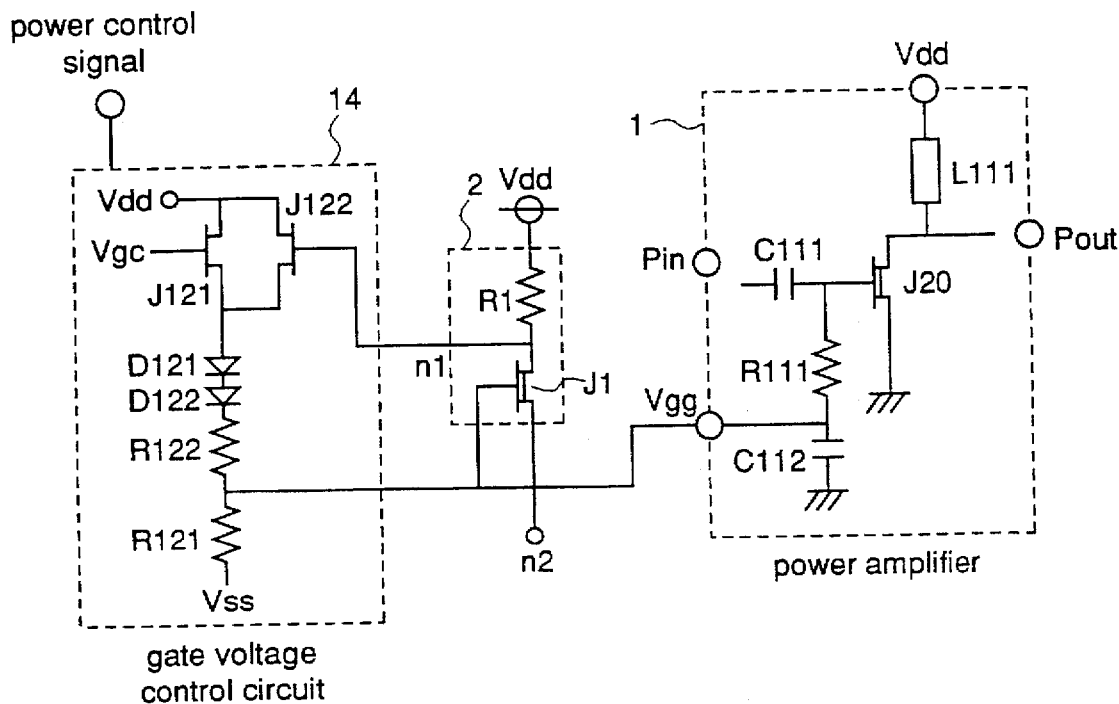
FIG. 6 is a diagram illustrating a power amplifier circuit according to a fifth embodiment of the present invention.

FIG. 6 is a circuit diagram illustrating a power amplifier circuit according to a fifth embodiment of the invention. In this power amplifier circuit, the output from the inverter circuit 2 is input to the gate voltage control circuit 14, whereby the set value of the voltage $V_{gg}$ is controlled.

More specifically, in this fifth embodiment, the gate voltage control signal $V_{gc}$ is controlled with a positive voltage. For this purpose, the gate voltage control circuit 14 comprises an FET J121 and an FET J122 which are connected in parallel, and diodes D121, D122 and resistors R121, R122 which are connected to the source terminal of the FET J121. The output n1 of the inverter circuit 2 is connected to the gate terminal of the FET J122.

A description is given of the operation of the power amplifier circuit. When the gate voltage control signal $V_{gc}$ is "High", the gate voltage control circuit 14 outputs a voltage $V_{gg}$ which is obtained by dividing, with the resistors R121 and R122, a difference between the gate to source voltage $V_{gsJ121}$ of the FET J121 and the negative voltage $V_{ss}$. The voltage $V_{gg}$ is given by $$V_{gg} = (V_{gc} - V_{gsJ121} - VF \times 2 - V_{ss}) \times RJ121/(R121+R122) + V_{ss} \quad (3)$$

So, when the gate voltage control signal $V_{gc}$ is 2 V, the gate to source voltage $V_{gsJ121}$ is 0.2 V, $V_{ss}$ is –2 V, the forward voltage $V_f$ of the diodes D121 and D122 is 0.6 V, and the resistances of the resistors R121 and R122 are respectively 18 KΩ and 8 KΩ, the voltage $V_{gg}$ is calculated as follows.

$$\begin{aligned} V_{gg} &= 2.6 \times 18/26 - 2 \\ &= -0.2 \end{aligned} \quad (4)$$

Since the FET J1 is in the ON state at this voltage $V_{gg}$, the gate voltage n1 of the FET J122 is about 0 V due to the voltage drop by the resistor R1 and this voltage is lower than the voltage of the gate voltage control signal $V_{gc}$, so that the FET J122 is in the OFF state. Therefore, the gate voltage control circuit 14 operates in the same way as without the FET J122.

When the gate voltage control signal $V_{gc}$ is "Low", i.e., when $V_{gc}$ is equal to 0 V, the voltage $V_{gg}$ is given by $$\begin{aligned} V_{gg} &= 0.6 \times 18/26 - 2 \\ &= -1.81 \end{aligned} \quad (5)$$

In this case, since the voltage $V_{gg}$ is input to the FET J1 constituting the inverter circuit 2, the FET J1 turns off, and the gate voltage n1 of the FET J122 increases. The voltage n1 increases to the power supply voltage $V_{dd}$, and this signal is input to the FET J122 in the gate voltage control circuit 14. Thereby, the FET J122 turns on, and current flows through the FET J122. As a result, the voltage $V_{gg}$ is as high as that given by formula (4). This high voltage $V_{gg}$ turns on the FET J1 in the inverter circuit 2 and reduces the gate voltage n1 of the FET J122, i.e., a feedback function results, whereby the current in the FET J1 is cut off. Therefore, the voltage $V_{gg}$ can be set at the lowest.

That is, since the voltage $V_p$ of the FET J20 constituting the power amplifier 1 is equal to the voltage $V_p$ of the FET J1 constituting the inverter circuit 2, when this voltage is used as $V_{gg}$, the current flowing in the power amplifier 1 is the smallest. In this way, it is possible to automatically set the voltage $V_{gg}$ to a voltage that makes the current in the power amplifier 1 smallest.

In the circuit shown in FIG. 6, the source electrode n2 of the FET J1 constituting the inverter circuit 2 may be connected to the ground or to a circuit as described for the third or fourth embodiment of the invention.

In this fifth embodiment of the invention, in addition to the same effects as provided by the first embodiment, the current flow due to the voltage $V_{ss}$ is reduced as compared to the first embodiment. Especially, when a negative voltage is generated in a circuit integrated with the power amplifier 1 on the same chip, it is necessary to reduce the current flow due to the negative voltage. That is, in the first to fourth embodiments, since the circuit comprising the FET J2 and the resistor R2 is inserted between the voltage $V_{gg}$ and the power supply voltage terminal $V_{dd}$ to control the current, there is a risk of an increase in the current flow due to the voltage $V_{gg}$. The voltage $V_{gg}$ is a negative voltage as mentioned above and generated with the voltage $V_{ss}$ as a reference, and the allowable current of $V_{ss}$ is as low as 1 mA. Therefore, it is necessary to reduce the current flowing through the FET J2 and the resistor R2. In this fifth embodiment of the invention, since the FET J122 is connected in parallel with the FET J121 serving as a gate voltage setting means of the gate voltage control circuit 14 that generates the voltage $V_{gg}$, the current flow due to $V_{ss}$ or $V_{gg}$ does not increase.

[Embodiment 6]

Figure 7:
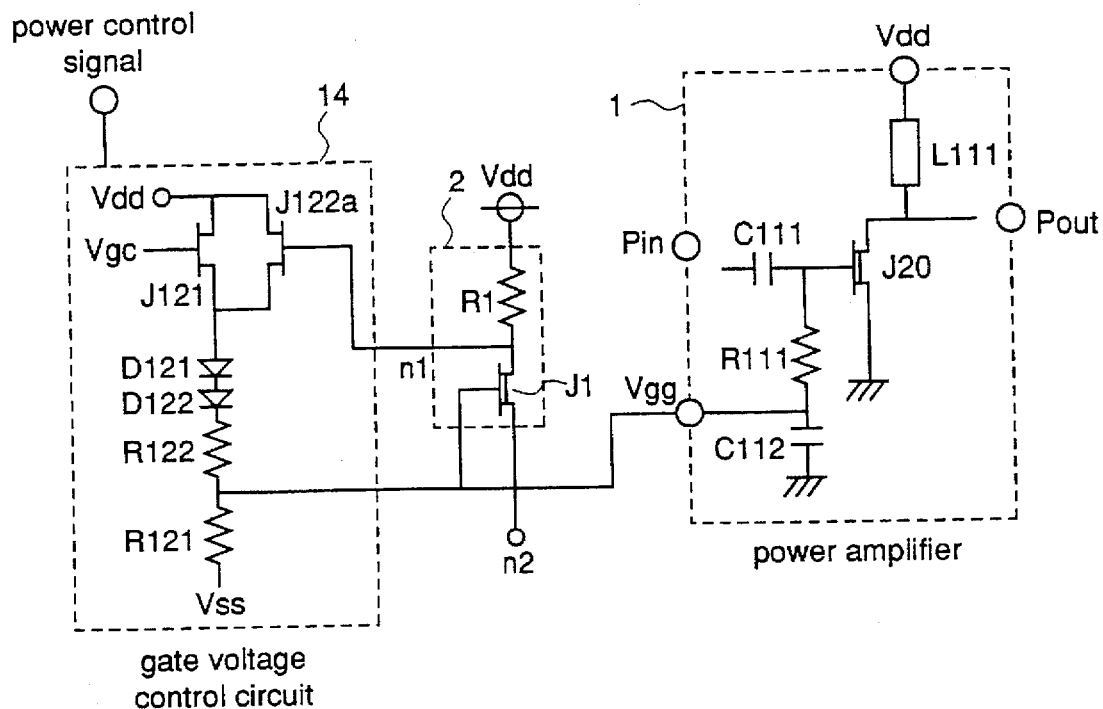
FIG. 7 is a diagram illustrating a power amplifier circuit according to a sixth embodiment of the present invention.

FIG. 7 is a circuit diagram illustrating a power amplifier circuit according to a sixth embodiment of the invention. In the fifth embodiment of the invention, although the FET J122 is included in the gate voltage control circuit 14 to control the voltage $V_{gg}$, this FET J122 causes an increase in the chip size. In order to reduce the chip size, the size of the FET J122 must be as small as possible. In this sixth embodiment, as shown in FIG. 7, an FET J122a smaller than the FET J121 is employed in place of the FET J122. Since the threshold voltage $V_{th}$ of an FET increases with a reduction in gate width, when the size (gate width) of the FET J122a is reduced, the gate voltage output from the gate voltage control circuit 14 is determined by the input signal $V_{gc}$ to the FET J121, so that the operating characteristics of the gate voltage control circuit 14 is not significantly influenced by the input n1 to the FET J122a.

Therefore, the switching of the feedback operation according to the fifth embodiment becomes slow, so that unwanted variations in the voltage $V_{gg}$ and unstable operation due to the feedback function are avoided.

[Embodiment 7]

Figure 8:
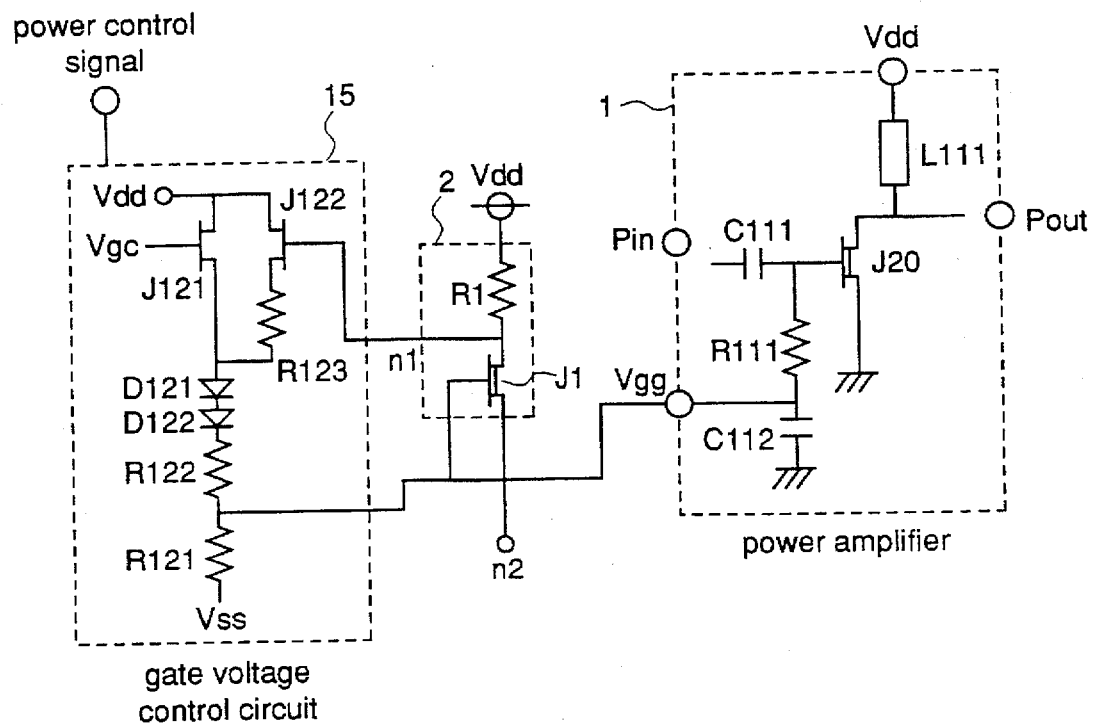
FIG. 8 is a diagram illustrating a power amplifier circuit according to a seventh embodiment of the present invention.
Figure 9:
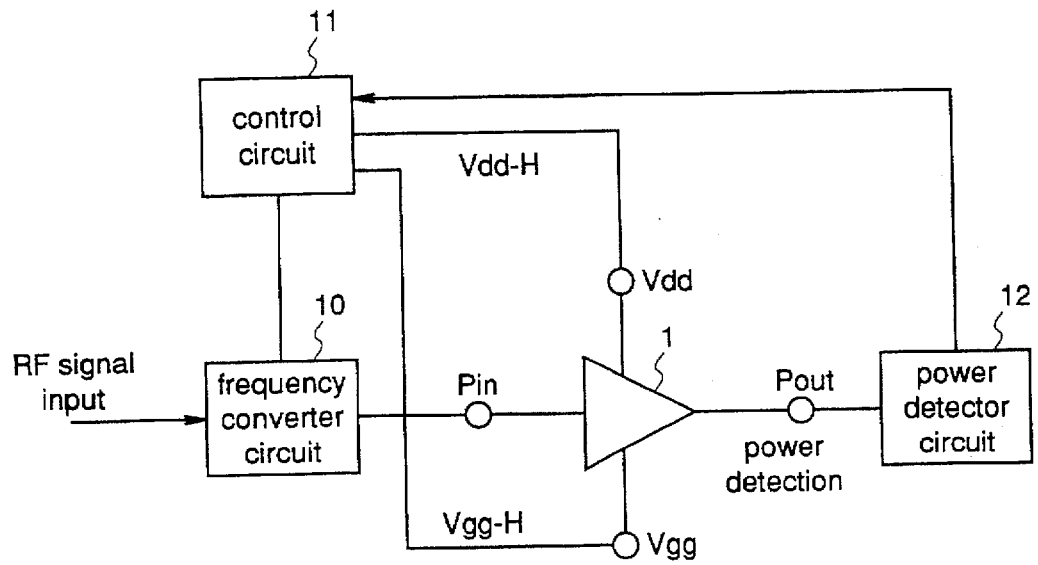
FIG. 9 is a block diagram illustrating a power amplifier and a control circuit therefor, used in a conventional portable telephone.
Figure 10:
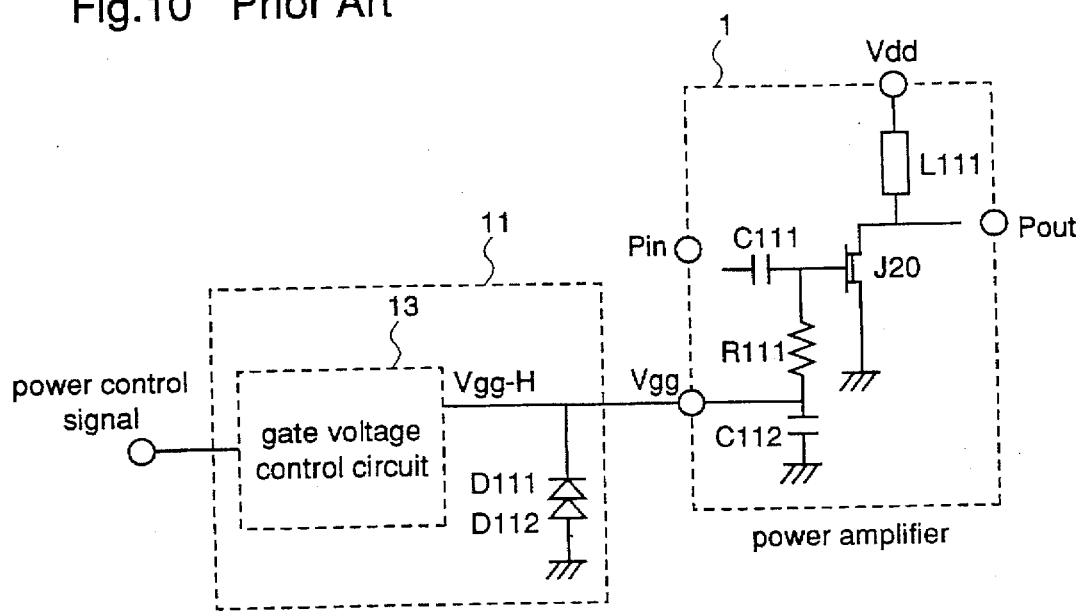
FIG. 10 is a diagram illustrating a power amplifier and a peripheral circuit for controlling the power of the amplifier, used in a conventional PHS.
Figure 11:
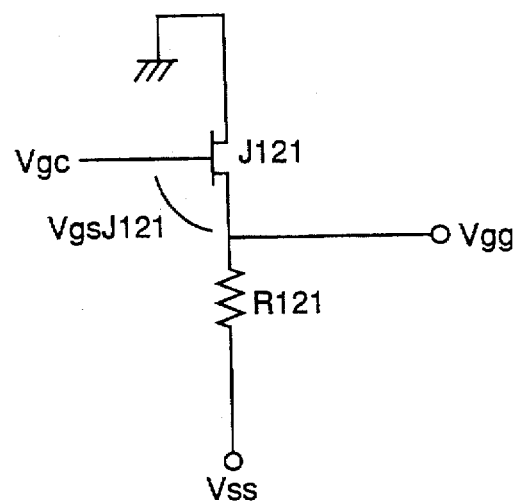
FIG. 11 is a diagram illustrating a gate voltage control circuit in a conventional power amplifier.

FIG. 8 is a diagram illustrating a power amplifier circuit according to a seventh embodiment of the present invention. In the power amplifier circuit shown in FIG. 7, the trouble due to the feedback operation is solved by controlling the gate width of the FET J122a connected in parallel with the FET J121. In this seventh embodiment of the invention, however, in the gate voltage control circuit 15, a resistor R123 is connected to the source of the FET J122 to solve the trouble due to the feedback operation, such as variations in the voltage $V_{gg}$.

Further, in the sixth embodiment, the initial characteristics of the FET J112a are not maintained due to variations in wafer processing. In this seventh embodiment, however, since the problem is solved by adding an element, i.e., the resistor R123, the circuit is not adversely affected by variations in the wafer processing, so that the set value of the voltage $V_{gg}$ is attained, resulting in an improved yield.

In the foregoing description, emphasis has been placed on a variable power amplifier. However, the present invention may be applied to a circuit employed only in a low power consumption state. In this case, the power amplifier can stably operate even when current is reduced to the utmost.

What is claimed is:

1. A power amplifier circuit comprising:

power amplifying means comprising a first field effect transistor having a gate with a gate length, the first field effect transistor having a threshold voltage;

gate voltage supply means for supplying a gate voltage to the gate of the first field effect transistor;

gate voltage control means comprising a second field effect transistor having a threshold voltage that is the same as the threshold voltage of the first field effect transistor, the gate voltage control means receiving, as an input voltage, the gate voltage output from the gate voltage supply means, and increasing the gate voltage when the gate voltage is lower than the threshold voltage of the first field effect transistor for preventing the first field effect transistor from being pinched off.

2. The power amplifier circuit of claim 1 wherein the gate voltage control means comprises:

an inverter circuit comprising the second field effect transistor for receiving the gate voltage; and a third field effect transistor connected between the gate of the first field effect transistor and a power supply, and having a gate to which an output from the inverter circuit is applied.

3. The power amplifier circuit of claim 1 wherein the second field effect transistor has a gate length shorter than that of the first field effect transistor.

4. The power amplifier circuit of claim 1 wherein an electrode of the second field effect transistor is set at a voltage lower than ground voltage.

5. The power amplifier circuit of claim 4 wherein the electrode of the second field effect transistor set at a voltage lower than the ground voltage is connected to a negative voltage terminal through a diode.

6. The power amplifier circuit of claim 4 including a normally-off field effect transistor wherein the electrode of the second field effect transistor set at a voltage lower than the ground voltage is connected to a source electrode of the normally-off field effect transistor, gate and drain electrodes of which are connected to a grounding terminal, and is connected to a negative voltage terminal through a circuit comprising a resistor.

7. The power amplifier circuit of claim 1 wherein:

the gate voltage control means comprises circuit comprising the second field effect transistor for receiving the gate voltage; and the gate voltage supply means comprises a source follower circuit comprising a third field effect transistor having a gate width, and a fourth field effect transistor connected in parallel with the third field effect transistor and having a gate to which an output from the inverter circuit is applied, wherein the gate voltage control means supplies current to the gate voltage supply means.

8. The power amplifier circuit of claim 7 wherein the fourth field effect transistor has a gate width narrower than the gate width of the third field effect transistor.

9. The power amplifier circuit of claim 7 including a resistor element connected in series to the fourth field effect transistor.

* * * * *